(12) United States Patent
Yu

(10) Patent No.: US 10,388,908 B1
(45) Date of Patent: Aug. 20, 2019

(54) DISPLAY PANEL AND DISPLAY APPARATUS HAVING THE SAME

(71) Applicant: BOE Technology Group Co., Ltd., Beijing (CN)

(72) Inventor: Donghui Yu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/161,358

(22) Filed: Oct. 16, 2018

(30) Foreign Application Priority Data

Mar. 26, 2018 (CN) .................... 2018 2 0415271 U

(51) Int. Cl.
*H01L 51/56* (2006.01)
*H01L 51/52* (2006.01)

(52) U.S. Cl.
CPC .......... *H01L 51/5246* (2013.01); *H01L 51/56* (2013.01)

(58) Field of Classification Search
CPC combination set(s) only.
See application file for complete search history.

(56) References Cited

U.S. PATENT DOCUMENTS

2006/0158111 A1* 7/2006 Hayashi .............. H01L 51/5246
313/512
2007/0206152 A1* 9/2007 Katsumura ........... G02F 1/1341
349/190

* cited by examiner

*Primary Examiner* — Fernando L Toledo
*Assistant Examiner* — Valerie N Newton
(74) *Attorney, Agent, or Firm* — Westman, Champlin & Koehler, P.A.

(57) ABSTRACT

Embodiments of the present disclosure provide a display panel and a display apparatus having the same. The display panel includes: a first substrate; a second substrate; a display component on the first substrate; a first sealing adhesive strip disposed between the first substrate and the second substrate, formed of a first sealing adhesive, and surrounding a periphery of the display component to bound a first sealed region having corners; and a second sealing adhesive strip disposed between the first substrate and the second substrate, formed of a second sealing adhesive, and surrounding a periphery of the first sealing adhesive strip to bound a second sealed region having corners. At least one of the corners of one of the first and second sealed regions is formed with a chamfer that faces one of the corners of the other of the first and second sealed regions.

16 Claims, 3 Drawing Sheets

DISPLAY PANEL AND DISPLAY APPARATUS HAVING THE SAME

CROSS-REFERENCE TO RELATED APPLICATION

This application claims priority to Chinese Patent Application No. 201820415271.7, filed on Mar. 26, 2018, and entitled "DISPLAY PANEL AND DISPLAY APPARATUS HAVING THE SAME", the whole disclosure of which is incorporated herein by reference.

TECHNICAL FIELD

Embodiments of the present disclosure relate to a display panel and a display apparatus having the same.

BACKGROUND

An organic light-emitting diode (OLED) is sensitive to moisture. Generally, a conventional OLED is packaged by a water-resistant ultraviolet-curing epoxy resin.

SUMMARY

Embodiments of the present disclosure provide a display panel comprising: a first substrate; a second substrate disposed opposite to the first substrate; a display component disposed on the first substrate; a first sealing adhesive strip disposed between the first substrate and the second substrate, formed of a first sealing adhesive, and surrounding a periphery of the display component to bound a first sealed region having a plurality of corners; and a second sealing adhesive strip disposed between the first substrate and the second substrate, formed of a second sealing adhesive, and surrounding a periphery of the first sealing adhesive strip to bound a second sealed region having a plurality of corners, wherein at least one of the plurality of corners of one of the first sealed region and the second sealed region is formed with a chamfer that faces one of the plurality of corners of the other of the first sealed region and the second sealed region.

According to embodiments of the present disclosure, each of the plurality of corners of the one of the first sealed region and the second sealed region is formed with the chamfer that faces one of the plurality of corners of the other of the first sealed region and the second sealed region.

According to embodiments of the present disclosure, one of the first sealing adhesive strip and the second sealing adhesive strip has a first polygonal shape, the other of the first sealing adhesive strip and the second sealing adhesive strip has a second polygonal shape, and a side, constituting the chamfer, of the one of the first sealing adhesive strip and the second sealing adhesive strip faces a corner of the other of the first sealing adhesive strip and the second sealing adhesive strip.

According to embodiments of the present disclosure, the side of the one of the first sealing adhesive strip and the second sealing adhesive strip comprises a first side, and a second side shorter than the first side; and the second side of the one of the first sealing adhesive strip and the second sealing adhesive strip constitutes the chamfer and faces the corner of the other of the first sealing adhesive strip and the second sealing adhesive strip.

According to embodiments of the present disclosure, the one of the first sealing adhesive strip and the second sealing adhesive strip has an octagonal shape, and the other of the first sealing adhesive strip and the second sealing adhesive strip has a quadrangular shape.

According to embodiments of the present disclosure, the first sealed region is filled with a third sealing adhesive.

According to embodiments of the present disclosure, the third sealing adhesive has a less viscosity than the first sealing adhesive.

According to embodiments of the present disclosure, the display panel further comprises: a moisture absorbing material strip, wherein the moisture absorbing material strip is formed of a mixture containing an adhesive and a moisture absorbing material and is disposed on one of the first substrate and the second substrate, and at least a portion of the moisture absorbing material strip is covered by at least one of the first sealing adhesive strip and the second sealing adhesive strip.

According to embodiments of the present disclosure, the moisture absorbing material strip comprises particles or bars of the mixture.

According to embodiments of the present disclosure, the one of the first substrate and the second substrate is formed with a groove within which the moisture absorbing material strip is disposed.

According to embodiments of the present disclosure, the one of the first substrate and the second substrate is formed with a groove within which the moisture absorbing material strip is disposed.

According to embodiments of the present disclosure, the adhesive of the moisture absorbing material strip has a viscosity greater than 5000 centipoises.

According to embodiments of the present disclosure, the adhesive of the moisture absorbing material comprises a non-curing adhesive, a delay curing adhesive, a thermosetting adhesive, or an ultraviolet-curing adhesive.

According to embodiments of the present disclosure, the first sealing adhesive strip and the second sealing adhesive strip are separated from each other.

According to embodiments of the present disclosure, the first sealing adhesive strip and the second sealing adhesive strip abut against each other except the corners.

Embodiments of the present disclosure provide a display apparatus comprising the above display panel.

Additional aspects and advantages of the present disclosure will be set forth in part in the description which follows and, in part, will be apparent from the description, or may be learned by practice of the present disclosure.

BRIEF DESCRIPTION OF THE DRAWINGS

The above and/or additional aspects and advantages of the present disclosure will be apparent and more readily appreciated from the following description of embodiments taken in conjunction with the accompanying drawings, in which.

DETAILED DESCRIPTION

Figure 1:
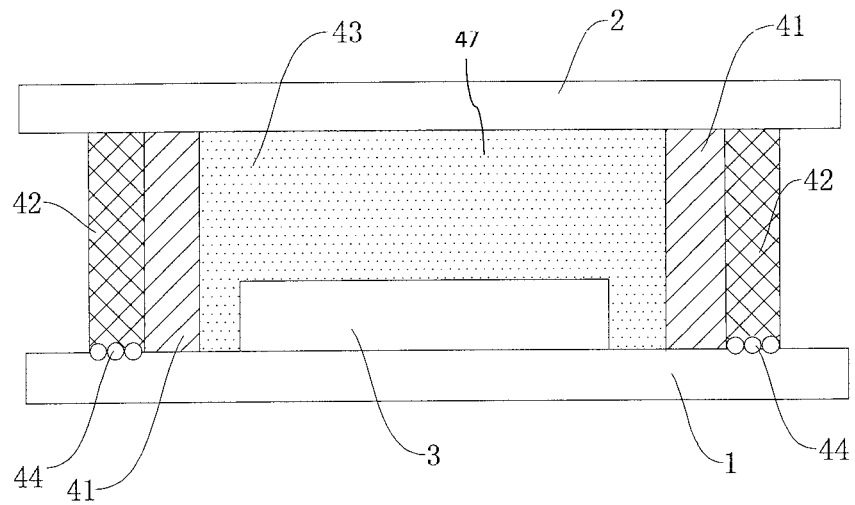
FIG. 1 is a section view of a display panel according to an embodiment of the present disclosure.

Reference will now be made in detail to the embodiments of the present disclosure, examples of which are illustrated in the accompanying drawings. The same or similar reference numerals refer to the same or similar elements or elements having the same or similar function throughout. The embodiments described below with reference to the accompany drawings are illustrative, are only used to explain the present disclosure, and should not be construed to limit the present disclosure.

A display panel 100 according to an embodiment of the present disclosure will now be described with reference to FIGS. 1-5.

Referring to FIGS. 1 to 5, The display panel 100 according to the embodiment of the present disclosure includes: a first substrate 1; a second substrate 2 disposed opposite to the first substrate 1; a display component 3 disposed on the first substrate 1; a first sealing adhesive strip 41 disposed between the first substrate 1 and the second substrate 2, formed of a first sealing adhesive, and surrounding a periphery of the display component 3 to bound a first sealed region 43 having a plurality of corners 46; and a second sealing adhesive strip 42 disposed between the first substrate 1 and the second substrate 2, formed of a second sealing adhesive, and surrounding a periphery of the first sealing adhesive strip 41 to bound a second sealed region 45 having a plurality of corners 46. At least one of the plurality of corners 46 of one of the first sealed region 43 and the second sealed region 45 is formed with a chamfer 5 that faces one of the plurality of corners 46 of the other of the first sealed region 43 and the second sealed region 45.

Figure 2:
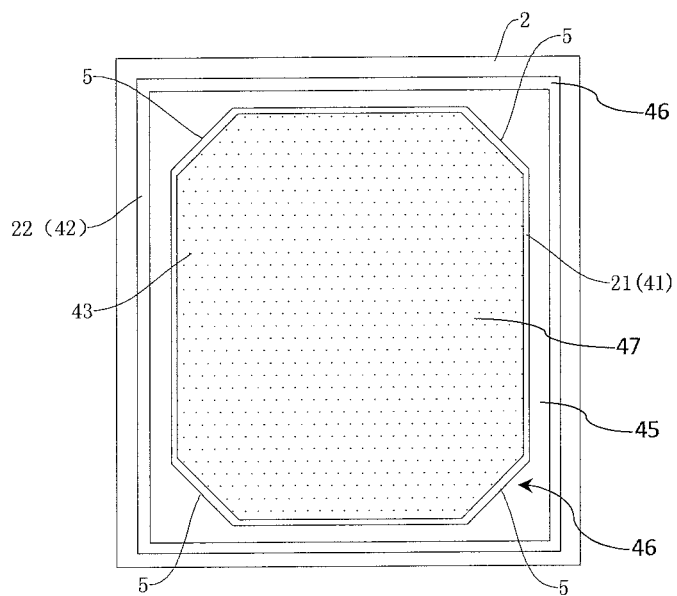
FIG. 2 is a bottom view of a second substrate according to an embodiment of the present disclosure.
Figure 3:
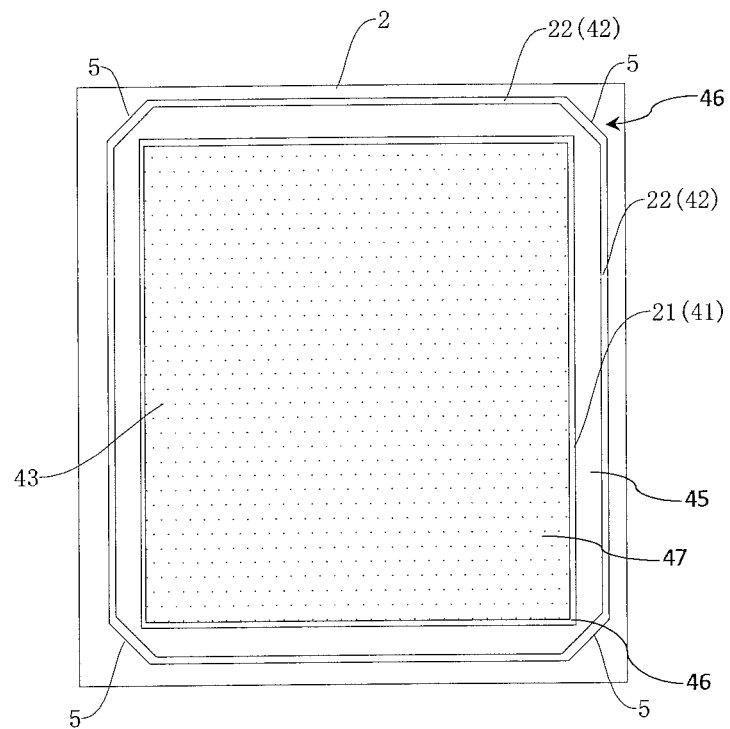
FIG. 3 is a bottom view of a second substrate according to another embodiment of the present disclosure.

Referring to FIGS. 1 to 3, in embodiments of the present disclosure, the first sealing adhesive strip 41 and the second sealing adhesive strip 42 are separated from each other. Alternatively, portions of the first sealing adhesive strip 41 and the second sealing adhesive strip 42 excepting the corners 46 abut against each other.

Referring to FIGS. 2 and 3, in embodiments of the present disclosure, each of the plurality of corners 46 of the one of the first sealed region 43 and the second sealed region 45 is formed with the chamfer 5 that faces one of the plurality of corners 46 of the other of the first sealed region 43 and the second sealed region 45. Referring to FIGS. 2 and 3, in embodiments of the present disclosure, one of the first sealing adhesive strip 41 and the second sealing adhesive strip 42 has a first polygonal shape, the other of the first sealing adhesive strip 41 and the second sealing adhesive strip 42 has a second polygonal shape, and a side, constituting the chamfer 5, of the one of the first sealing adhesive strip 41 and the second sealing adhesive strip 42 faces a corner 46 of the other of the first sealing adhesive strip 41 and the second sealing adhesive strip 42.

Referring to FIGS. 2 and 3, in embodiments of the present disclosure, the side of the one of the first sealing adhesive strip 41 and the second sealing adhesive strip 42 includes a first side, and a second side shorter than the first side; and the second side of the one of the first sealing adhesive strip 41 and the second sealing adhesive strip 42 constitutes the chamfer 5 and faces the corner 46 of the other of the first sealing adhesive strip 41 and the second sealing adhesive strip 42. For example, the one of the first sealing adhesive strip 41 and the second sealing adhesive strip 42 has an octagonal shape, and the other of the first sealing adhesive strip 41 and the second sealing adhesive strip 42 has a quadrangular shape.

Referring to FIGS. 1 to 3, in embodiments of the present disclosure, the first sealed region 43 is filled with a third sealing adhesive. The third sealing adhesive may have a less viscosity than the first sealing adhesive.

As shown in FIG. 1, a display panel 100 according to an embodiment of the present disclosure includes: a first substrate 1 and a second substrate 2 disposed opposite to each other. The display panel 100 may be an organic light-emitting diode (OLED) panel. In this case, the first substrate 1 may be an OLED array substrate, while the second substrate 2 may be a cover plate. Of course, the display panel 100 may also be any other display panel 100 in which a sealing adhesive strip needs to be disposed between its two substrates. A description will be made as below by taking an OLED panel serving as the display panel 100 as an example.

According to some embodiments of the present disclosure, a display component 3 is disposed on the first substrate 1. The display component 3 may be an element and/or a device such as a thin film transistor, an organic light-emitting element and a transparent electrode. The first substrate 1 and/or the second substrate 2 are/is provided with a first application region 21 in which a first sealing adhesive for forming the first sealing adhesive strip 41 is applied, and a second application region 22 in which a second sealing adhesive for forming the second sealing adhesive strip 42 is applied. In other words, only the first substrate 1 may be provided with the first application region 21 in which the first sealing adhesive for forming the first sealing adhesive strip 41 is applied, and the second application region 22 in which the second sealing adhesive for forming the second sealing adhesive strip 42 is applied; only the second substrate 2 is provided with the first application region 21 in which the first sealing adhesive for forming the first sealing adhesive strip 41 is applied, and the second application region 22 in which the second sealing adhesive for forming the second sealing adhesive strip 42 is applied; or, the first substrate 1 is provided with the first application region 21 in which the first sealing adhesive for forming the first sealing adhesive strip 41 is applied, and the second application region 22 in which the second sealing adhesive for forming the second sealing adhesive strip 42 is applied, and the second substrate 2 is provided with the first application region 21 in which the first sealing adhesive for forming the first sealing adhesive strip 41 is applied, and the second application region 22 in which the second sealing adhesive for forming the second sealing adhesive strip 42 is applied. In a packaging process, the second substrate 2 may be pressed onto the first substrate 1, thereby completing packaging. The first application region 21 surrounds a periphery of the display component 3, and the second application region 22 surrounds a periphery of the first application region 21. At least one corner 46 of one of the first application region 21 and the second application region 22 is formed with a chamfer 5 that faces a corner 46 of the other of the first application region 21 and the second application region 22. The first sealing adhesive for forming the first sealing adhesive strip 41 in the first application region 21 and the second sealing adhesive for forming the second sealing adhesive strip 42 in the second application region 22 may form a double-layer sealing adhesive dam. The first application region 21 is located inside the second application region 22. An inside of the first application region 21 may define a display area, and the second application region 22 may function to define a packaging region. The first sealing adhesive for forming the first sealing adhesive strip 41 and the second sealing adhesive for forming the second sealing adhesive strip 42 can hermetically bond the first substrate 1 and the second substrate 2 together. The first application region 21 and the second application region 22 may abut against each other, or the first application region 21 and the second application region 22 may be separated from each other.

Referring to FIGS. 1 to 3, the first application region 21 and the second application region 22 may be each formed in a ring shape. For example, the first application region 21 and the second application region 22 may be each formed in a quadrangular ring shape such as a square ring shape or a rectangular ring shape. A corner 46 of one of the first application region 21 and the second application region 22 may be formed with a chamfer 5. For example, at least one corner of the first application region 21 is formed with a chamfer 5 that faces a corner of the second application region 22 as shown in FIG. 2, or at least one corner of the second application region 22 is formed with a chamfer 5 that faces a corner of the first application region 21 as shown in FIG. 3.

Thereby, the corner 46 of the one of the first application region 21 and the second application region 22 may be formed with the chamfer 5 constituting a side, so that the side faces the corner 46 of the other of the first application region 21 and the second application region 22, effectively improving moisture barrier capability of the corner 46 which otherwise would be prone to be intruded by moisture. Therefore, the packaging effect of the entire display panel 100 and the waterproof performance of the display panel 100 and thus the picture displaying effect of the display panel 100 can be improved, and the service life of the display panel 100 can be prolonged. In a double-layer sealing adhesive dam, if the corner 46 of any one of the first application region 21 and the second application region 22 is formed with no chamfer 5 constituting the side, although the first sealing adhesive for forming the first sealing adhesive strip 41 and the second sealing adhesive for forming the second sealing adhesive strip 42 can partially block moisture, there are cases where external moisture penetrates into the display area. This penetration is more notable especially at the corners of the display area.

In the display panel 100 according to the embodiments of the present disclosure, the corner 46 of the first application region 21 or the second application region 22 is formed with the chamfer 5 constituting the side, so that the side faces the corner 46 of the second application region 22 or the first application region 21. Therefore, the packaging effect at the corners 46 and thus the packaging effect of the entire display panel 100 are improved, facilitating improvement of the picture displaying effect of the display panel 100, and prolongation of the service life of the display panel 100.

According to an embodiment of the present disclosure, the chamfer 5 includes at least one of a straight line-shaped segment and a curve-shaped segment such as an arc-shaped segment.

According to some embodiments of the present disclosure, each corner 46 of one of the first application region 21 and the second application region 22 is formed with a chamfer 5. Specifically, each corner 46 of the first application region 21 may be formed with a chamfer 5, or each corner 46 of the second application region 22 may be formed with a chamfer 5. Therefore, the packaging effect of the display panel 100 is further improved, thereby improving the picture displaying effect of the display panel 100, and prolonging the service life of the display panel 100.

According to some embodiments of the present disclosure, one of the first application region 21 and the second application region 22 may be formed in a quadrangular shape, while the other of the first application region 21 and the second application region 22 is formed in an octagonal shape. Referring to FIG. 2, the first application region 21 may be an octagonal region formed by chamfering each corner of a quadrangular region, i.e. each corner of the first application region 21 is formed with an oblique line-shaped segment, while the second application region 22 is formed in a quadrangular shape. Referring to FIG. 3, the second application region 22 may be an octagonal region formed by chamfering each corner of a quadrangular region, i.e. each corner of the second application region 22 is formed with an oblique line-shaped segment, while the first application region 21 is formed in a quadrangular shape. Thereby, the packaging effect of the display panel 100 can be improved, and the first sealing adhesive for forming the first sealing adhesive strip 41 and the second sealing adhesive for forming the second sealing adhesive strip 42 can be conveniently applied, improving packaging efficiency.

According to some embodiments of the present disclosure, a sealed region 43 is defined between the first substrate 1 and the second substrate 2 by the first sealing adhesive strip 41, and is filled with a third sealing adhesive 47. Thereby, an adhesive force between the first substrate 1 and the second substrate 2 can be increased.

According to some embodiments of the present disclosure, the third sealing adhesive 47 has a less viscosity than the first sealing adhesive for forming the first sealing adhesive strip 41. The first sealing adhesive for forming the first sealing adhesive strip 41 and the second sealing adhesive for forming the second sealing adhesive strip 42 may have the same viscosity. The first sealing adhesive for forming the first sealing adhesive strip 41 and the second sealing adhesive for forming the second sealing adhesive strip 42 are high-viscosity sealing adhesives, and have a viscosity greater than 100000 cp, while the third sealing adhesive 47 has a viscosity less than 1000 cp. Thereby, on one hand it can be ensured that there is a strong adhesive force between the first substrate 1 and the second substrate 2 to improve the structural stability of the display panel 100, while on the other hand, it can be ensured that the display area has a high light transmittance.

According to some embodiments of the present disclosure, the first sealing adhesive for forming the first sealing adhesive strip 41, the second sealing adhesive for forming the second sealing adhesive strip 42, and the third sealing adhesive 47 may be applied by dispensing, inkjet printing or the like. For example, the first sealing adhesive for forming the first sealing adhesive strip 41 and the second sealing adhesive for forming the second sealing adhesive strip 42 may be applied by dispensing, while the third sealing adhesive 47 may be applied by inkjet printing. The applications of the first sealing adhesive for forming the first sealing adhesive strip 41, the second sealing adhesive for forming the second sealing adhesive strip 42, and the third sealing adhesive 47 are simple and convenient.

Figure 4:
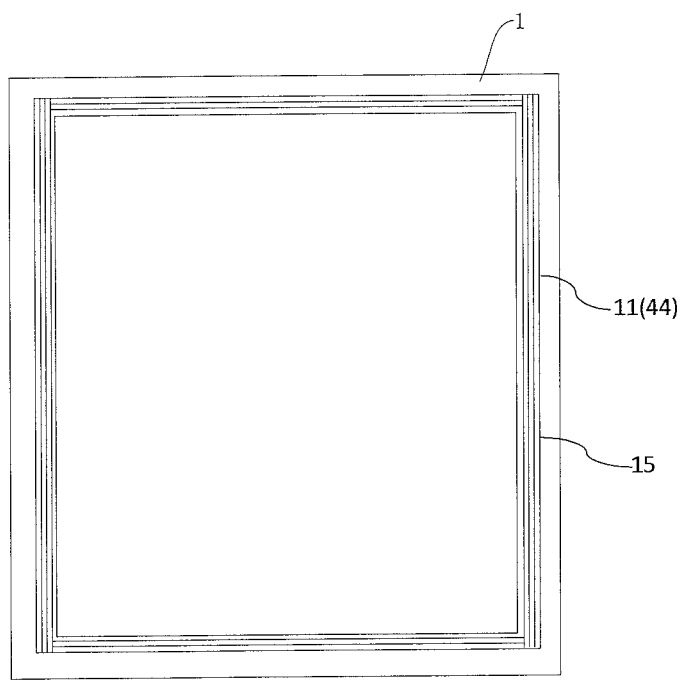
FIG. 4 is a top view of a first substrate according to an embodiment of the present disclosure.
Figure 5:
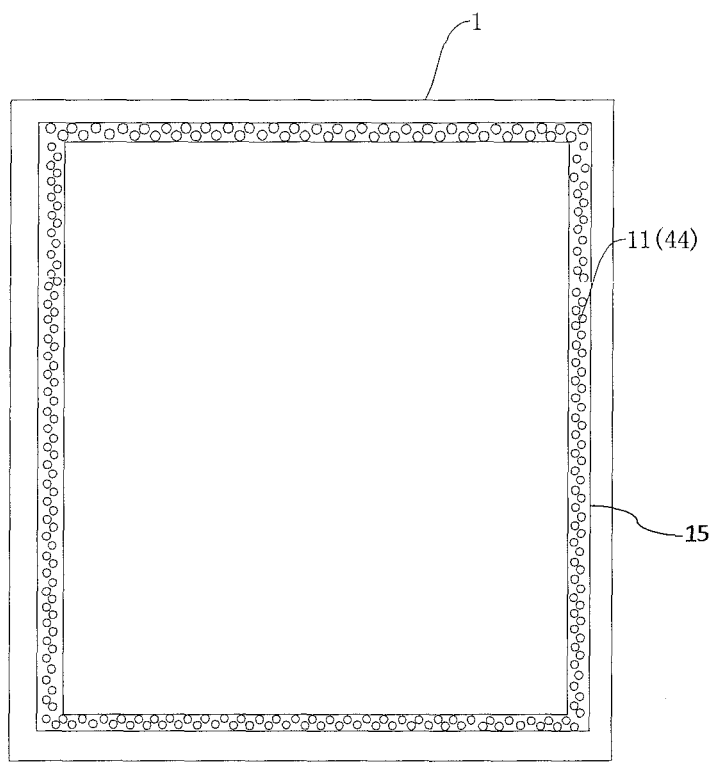
FIG. 5 is a top view of a first substrate according to another embodiment of the present disclosure.

Referring to FIGS. 1, 4 and 5, in embodiments of the present disclosure, the display panel 100 further includes a moisture absorbing material strip 44. The moisture absorbing material strip 44 is formed of a mixture containing an adhesive and a moisture absorbing material and is disposed on one of the first substrate 1 and the second substrate 2, and at least a portion of the moisture absorbing material strip 44 is covered by at least one of the first sealing adhesive strip 41 and the second sealing adhesive strip 42. Referring to FIGS. 4 and 5, the moisture absorbing material strip 44 includes particles or bars of the mixture. For example, the adhesive of the moisture absorbing material strip has a viscosity greater than 5000 cp. The adhesive of the moisture absorbing material may include a non-curing adhesive, a delay curing adhesive, a thermosetting adhesive, or an ultraviolet-curing adhesive.

Referring to FIGS. 1, 4 and 5, in embodiments of the present disclosure, the one of the first substrate 1 and the second substrate 2 is formed with a groove 15 within which the moisture absorbing material strip 44 is disposed.

According to some embodiments of the present disclosure, referring to FIGS. 1 to 5, one of the first substrate 1 and the second substrate 2 is provided with the first application region 21 and the second application region 22, while the other of the first substrate 1 and the second substrate 2 is provided with a third application region 11 in which the mixture containing the adhesive and the moisture absorbing material for forming the moisture absorbing material strip 44 is applied. The third application region 11 is aligned with at least one of the first application region 21 and the second application region 22, and the groove 15 is formed in the third application region 11.

For example, in the case where the first substrate 1 is provided with the first application region 21 and the second application region 22, the second substrate 2 is provided with the third application region 11 in which the mixture containing the adhesive and the moisture absorbing material for forming the moisture absorbing material strip 44 is applied. In the case where the second substrate 2 is provided with the first application region 21 and the second application region 22, the first substrate 1 is provided with the third application region 11 in which the mixture containing the adhesive and the moisture absorbing material for forming the moisture absorbing material strip 44 is applied.

According to some embodiments of the present disclosure, the third application region 11 may be aligned with only the first application region 21, the third application region 11 may be aligned with only the second application region 22, or, the third application region 11 may be aligned with both the first application region 21 and the second application region 22. Thereby, intruded moisture can be absorbed by the moisture absorbing material of the mixture for forming the moisture absorbing material strip 44, so that the waterproof effect of the display panel 100 is improved.

According to some embodiments of the present disclosure, the mixture containing the adhesive and the moisture absorbing material for forming the moisture absorbing material strip 44 is applied in dots or bars. In an example shown in FIG. 4, the mixture containing the adhesive and the moisture absorbing material for forming the moisture absorbing material strip 44 is applied in bars. In another example shown in FIG. 5, the mixture containing the adhesive and the moisture absorbing material for forming the moisture absorbing material strip 44 is applied in dots. Thereby, the particles and bars of the mixture can be formed. Moisture can be absorbed by the moisture absorbing material of the mixture for forming the moisture absorbing material strip 44. In addition, the porosity of the moisture absorbing material on the third application region 11 enhances a contact area of the moisture absorbing material of the mixture, improving the packaging effect.

According to some embodiments of the present disclosure, the third application region 11 is formed with the groove 15 within which the mixture containing the adhesive and the moisture absorbing material for forming the moisture absorbing material strip 44 is applied. As a result, the mixture containing the adhesive and the moisture absorbing material for forming the moisture absorbing material strip 44 can be conveniently applied in the third application region 11.

Embodiments of the present disclosure further provide a display apparatus including the display panel 100 according to the above embodiments of the present disclosure.

The display apparatus according to the embodiments of the present disclosure may include any products or parts having a display function such as an electronic paper, a mobile phone, a tablet computer, a television, a display, a notebook computer, a digital frame, and a navigator.

The waterproof performance of the display apparatus according to the embodiments of the present disclosure is improved due to the display panel 100 according to the above embodiments of the present disclosure.

While the embodiments of the present disclosure have been shown and described, it will be understood by those skilled in the art that various changes, modifications, substitutions and alterations may be made therein without departing from the principles and spirit of the present disclosure, the scope of which is defined in the appended claims and their equivalents.

What is claimed is:

1. A display panel comprising:
a first substrate;
a second substrate disposed opposite to the first substrate;
a display component disposed on the first substrate;
a first sealing adhesive strip disposed between the first substrate and the second substrate, formed of a first sealing adhesive, and surrounding a periphery of the display component to bound a first sealed region having a plurality of corners; and
a second sealing adhesive strip disposed between the first substrate and the second substrate, formed of a second sealing adhesive, and surrounding a periphery of the first sealing adhesive strip to bound a second sealed region having a plurality of corners,
wherein at least one of the plurality of corners of one of the first sealed region and the second sealed region is formed with a chamfer that faces one of the plurality of corners of the other of the first sealed region and the second sealed region.

2. The display panel of claim 1, wherein:
each of the plurality of corners of the one of the first sealed region and the second sealed region is formed with the chamfer that faces one of the plurality of corners of the other of the first sealed region and the second sealed region.

3. The display panel of claim 1, wherein:
one of the first sealing adhesive strip and the second sealing adhesive strip has a first polygonal shape, the other of the first sealing adhesive strip and the second sealing adhesive strip has a second polygonal shape, and a side, constituting the chamfer, of the one of the first sealing adhesive strip and the second sealing adhesive strip faces a corner of the other of the first sealing adhesive strip and the second sealing adhesive strip.

4. The display panel of claim 3, wherein:
the side of the one of the first sealing adhesive strip and the second sealing adhesive strip comprises a first side, and a second side shorter than the first side; and
the second side of the one of the first sealing adhesive strip and the second sealing adhesive strip constitutes the chamfer and faces the corner of the other of the first sealing adhesive strip and the second sealing adhesive strip.

5. The display panel of claim 3, wherein:
the one of the first sealing adhesive strip and the second sealing adhesive strip has an octagonal shape, and the other of the first sealing adhesive strip and the second sealing adhesive strip has a quadrangular shape.

6. The display panel of claim 1, wherein:
the first sealed region is filled with a third sealing adhesive.

7. The display panel of claim 6, wherein:
the third sealing adhesive has a less viscosity than the first sealing adhesive.

8. The display panel of claim 1, further comprising:
a moisture absorbing material strip, wherein the moisture absorbing material strip is formed of a mixture containing an adhesive and a moisture absorbing material and is disposed on one of the first substrate and the second substrate, and at least a portion of the moisture absorbing material strip is covered by at least one of the first sealing adhesive strip and the second sealing adhesive strip.

9. The display panel of claim 8, wherein:
the moisture absorbing material strip comprises particles or bars of the mixture.

10. The display panel of claim 8, wherein:
the one of the first substrate and the second substrate is formed with a groove within which the moisture absorbing material strip is disposed.

11. The display panel of claim 9, wherein:
the one of the first substrate and the second substrate is formed with a groove within which the moisture absorbing material strip is disposed.

12. The display panel of claim 8, wherein:
the adhesive of the moisture absorbing material strip has a viscosity greater than 5000 centipoises.

13. The display panel of claim 8, wherein:
the adhesive of the moisture absorbing material comprises a non-curing adhesive, a delay curing adhesive, a thermosetting adhesive, or an ultraviolet-curing adhesive.

14. The display panel of claim 1, wherein:
the first sealing adhesive strip and the second sealing adhesive strip are separated from each other.

15. The display panel of claim 1, wherein:
portions of the first sealing adhesive strip and the second sealing adhesive strip excepting the corners abut against each other.

16. A display apparatus comprising:
the display panel of claim 1.

* * * * *